United States Patent
Suy et al.

(10) Patent No.: US 10,921,277 B2
(45) Date of Patent: Feb. 16, 2021

(54) SENSOR ARRANGEMENT AND METHOD FOR GENERATING MEASUREMENT SIGNALS

(71) Applicant: ams Ag, Premstätten (AT)

(72) Inventors: Hilco Suy, Son En Breugel (NL); Dimitri Soccol, Rotselaar (BE)

(73) Assignee: AMS AG, Premstätten (AT)

( * ) Notice: Subject to any disclaimer, the term of this patent is extended or adjusted under 35 U.S.C. 154(b) by 137 days.

(21) Appl. No.: 16/077,039

(22) PCT Filed: Feb. 7, 2017

(86) PCT No.: PCT/EP2017/052608
§ 371 (c)(1),
(2) Date: Aug. 9, 2018

(87) PCT Pub. No.: WO2017/140530
PCT Pub. Date: Aug. 24, 2017

(65) Prior Publication Data
US 2019/0041349 A1    Feb. 7, 2019

(30) Foreign Application Priority Data
Feb. 18, 2016 (EP) .................................... 16156345

(51) Int. Cl.
*G01N 27/22* (2006.01)
*G01R 27/26* (2006.01)

(52) U.S. Cl.
CPC ......... *G01N 27/226* (2013.01); *G01N 27/221* (2013.01); *G01N 27/223* (2013.01); *G01R 27/2605* (2013.01); *G01N 2027/222* (2013.01)

(58) Field of Classification Search
CPC .. G01N 27/226; G01N 27/221; G01N 27/265; G01N 27/223; G01N 27/222; G01N 27/227; G01N 27/228; G01N 27/2605
See application file for complete search history.

(56) References Cited

U.S. PATENT DOCUMENTS 5,801,307 A * 9/1998 Netzer .............. B32B 17/10036
73/170.17
6,094,981 A * 8/2000 Hochstein ......... B32B 17/10036
73/170.17
(Continued)

FOREIGN PATENT DOCUMENTS

EP     1607739 A1    12/2005
EP     2565635 A1     3/2013
(Continued)

OTHER PUBLICATIONS

Kummer, A. M. et al.: "Configurable Electrodes for Capacitive—Type Sensors and Chemical Sensors" IEEE Sensors Journal, New York, NY, US, vol. 6, No. 1, Feb. 2006, pp. 3-9.
(Continued)

*Primary Examiner* — Lee E Rodak
(74) *Attorney, Agent, or Firm* — MH2 Technology Law Group LLP

(57) ABSTRACT

A sensor arrangement (10) comprises a capacitive sensor (11) with a first electrode line (12), a second electrode line (16) and a third electrode line (20) and a sensitive layer (30) arranged at the first, the second and the third electrode line (12, 16, 20). The sensor arrangement (10) comprises a readout circuit (50) that comprises a capacitance-to-digital converter (51), is coupled to the first, the second and the third electrode line (12, 16, 20) and is configured to generate a first measurement signal (S1) using the first and the second electrode line (12, 16) and a second measurement signal (S2) using at least the third electrode line (20).

13 Claims, 10 Drawing Sheets

(56) References Cited

U.S. PATENT DOCUMENTS

| | | |
|---|---|---|
| 8,633,047 B2 | 1/2014 | Hummel et al. |
| 2006/0096370 A1 | 5/2006 | Isogai et al. |
| 2006/0265155 A1 | 11/2006 | Goldfine et al. |
| 2012/0000285 A1* | 1/2012 | Waga .................... G01N 27/225 73/335.04 |
| 2012/0304742 A1* | 12/2012 | Cummins ............ G01N 27/121 73/31.06 |
| 2013/0187670 A1 | 7/2013 | Dooley et al. |
| 2014/0298884 A1* | 10/2014 | Mindlin .................. G01L 27/00 73/1.63 |
| 2015/0047430 A1* | 2/2015 | Benzel ................. G01N 27/225 73/335.04 |
| 2017/0038327 A1* | 2/2017 | Ledwosinska ....... G01N 27/228 |

FOREIGN PATENT DOCUMENTS

| | | | |
|---|---|---|---|
| EP | 2988122 A1 | 2/2016 | |
| WO | 200231481 A2 | 4/2002 | |
| WO | 2009066992 A2 | 5/2009 | |
| WO | WO-2012148254 A1 * | 11/2012 | ........... G01N 27/225 |

OTHER PUBLICATIONS

Vogt, B. "Water at polymer interfaces" NIST Center for Neutron Research National Institute of Standards and Technology; Jun. 18-23, 2012;retreived from the internet: www.ncnr.nist.gov/summershool/ss12/pdf/SS2012Vo_gt_interfacewater.pdf.

* cited by examiner

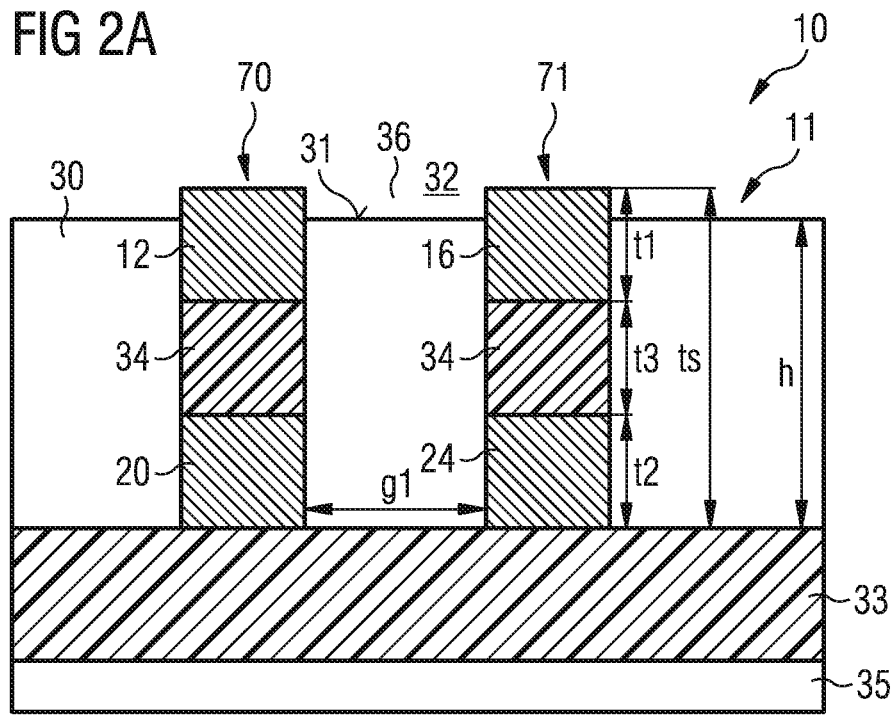
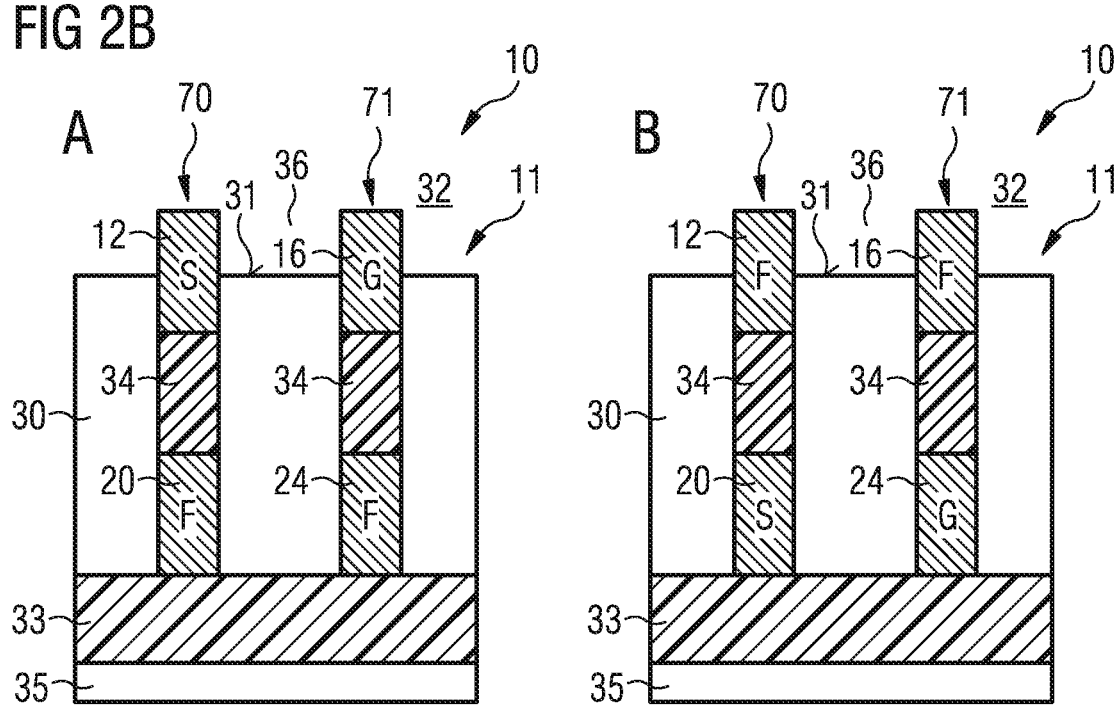

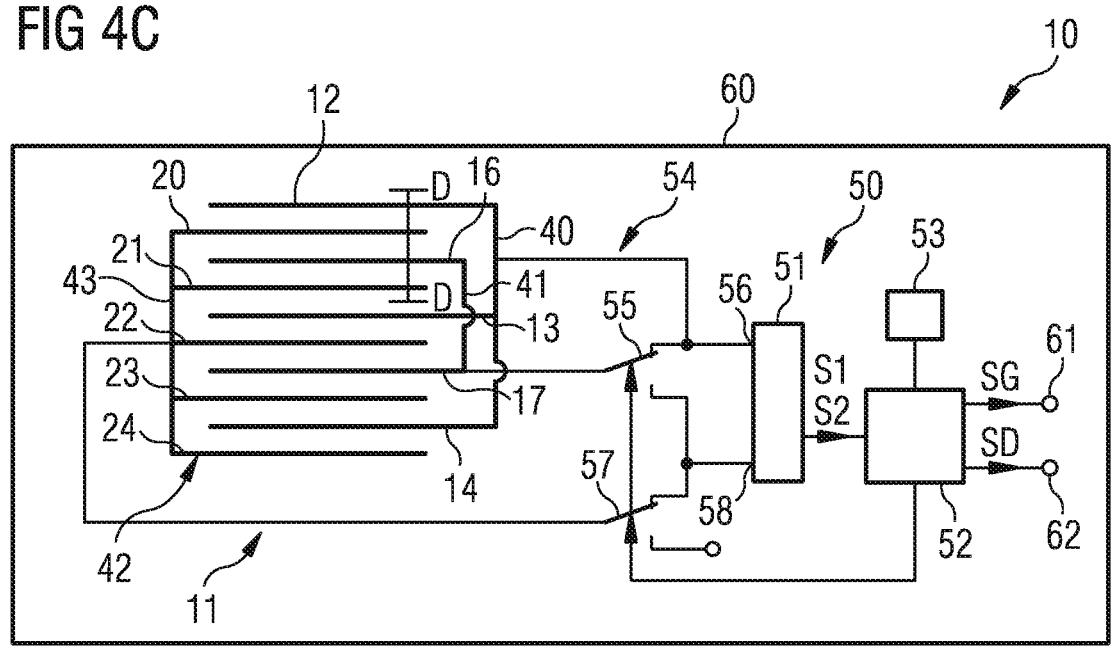

SENSOR ARRANGEMENT AND METHOD FOR GENERATING MEASUREMENT SIGNALS

BACKGROUND OF THE INVENTION

The present disclosure is related to a sensor arrangement and a method for generating measurement signals.

The sensor arrangement is configured as a chemical sensor arrangement. Thus, the sensor arrangement is designed for the measurement of a parameter in a gas or a liquid. For example, the sensor arrangement may be realized for the detection of humidity, i.e. for the detection of water molecules in air.

A capacitive sensor with a sensitive layer is often used for humidity detection. The humidity may change several parameters of the sensitive layer. However, only one parameter of the sensitive layer is commonly measured.

SUMMARY OF THE INVENTION

In an embodiment, a sensor arrangement comprises a capacitive sensor and a readout circuit. The capacitive sensor comprises a first electrode line, a second electrode line, a third electrode line and a sensitive layer. The sensitive layer is arranged at the first, the second and the third electrode lines. The readout circuit comprises a capacitance-to-digital converter, abbreviated converter. The readout circuit is coupled to the first, the second and the third electrode lines. The readout circuit is configured to generate a first measurement signal using the first and the second electrode lines and to generate a second measurement signal using at least the third electrode line.

Since the first, second and third electrode lines are arranged at the sensitive layer, more than one measurement signal can be generated and, thus, more than one parameter of the sensitive layer can be measured. Advantageously, the sensor arrangement allows more information to be gained out of the sensitive layer.

In an embodiment, the sensitive layer is in contact with the first, the second and the third electrode lines.

In an embodiment, the converter is coupled on its input side to the first, the second and the third electrode lines. The converter generates the first measurement signals and the second measurement signal.

In an alternative embodiment, the converter is coupled on its input side to the first and the second electrode lines. The converter generates the first measurement signal. The readout circuit comprises a further capacitance-to-digital converter—abbreviated further converter—that is coupled at least to the third electrode line. The further converter generates the second measurement signal.

In an embodiment, the sensor arrangement is realized as a chemical sensor arrangement. The chemical sensor arrangement may be implemented as a gas sensor arrangement. The gas sensor arrangement may be configured as a humidity sensor arrangement. Since water molecules are an example for a gas, a humidity sensor arrangement is an embodiment of a gas sensor arrangement.

In an embodiment, the sensitive layer is designed to absorb a gas to be detected, such as $CO_2$ or $SO_2$. The sensitive layer may change its permittivity depending on the absorbed gas. The sensitive layer may change its capacitance and/or its resistance depending on the absorbed gas.

In the case that the gas sensor arrangement is configured as a humidity sensor arrangement, the gas absorbed by sensitive layer are water molecules, $H_2O$. However, a humidity sensor often has a different behavior than a gas sensor for other gases, since water molecules are not burnable such as CO or hydrocarbons, have a high concentration and have an upper limit in air.

The sensitive layer may be a polymer. The sensitive layer may be made of a polyimide.

In an embodiment, the first, the second and the third electrode lines are configured such that the first measurement signal depends more on a swelling of the sensitive layer than the second measurement signal. The swelling of the sensitive layer may occur, when the sensitive layer absorbs the gas to be detected, for example the water molecules.

In an embodiment, the first measurement signal depends more on the changing thickness of the sensitive layer than the second measurement signal. The sensitive layer increases its thickness by the swelling.

The swelling may be a reversible swelling, a permanent swelling or a swelling that is partially reversible and partially permanent. In the case of a reversible swelling, the thickness of the sensitive layer increases with rising concentration of the gas to be detected, e.g. humidity, and decreases with decreasing concentration of the gas to be detected, e.g. humidity. In the case of a permanent swelling, the thickness of the sensitive layer does not decrease, when the concentration of the gas to be detected, e.g. humidity, decreases.

In an embodiment, the first, the second and the third electrode lines are configured such that the second measurement signal depends more on the bulk properties of the sensitive layer than the first measurement signal.

In an embodiment, the readout circuit provides a gas signal as a function of the first measurement signal and the second measurement signal. Thus, both the first and the second measurement signals are used to determine the gas signal. The gas signal may be a humidity signal.

The readout circuit may have a digital processor coupled to the converter. Alternatively, the digital processor of the readout circuit is coupled to the converter and the further converter. The digital processor may be implemented as a microcontroller, a microprocessor or a state machine. The readout circuit may comprises a memory coupled to the digital processor.

The digital processor may calculate the gas signal.

In an embodiment, the digital processor calculates the gas signal using an equation and/or a look-up table with the first and the second measurement signals as inputs.

In an embodiment, the digital processor calculates a first gas signal using a first equation and/or a first look-up table with the first measurement signal as an input. Moreover, the digital processor calculates a second gas signal using a second equation and/or a second look-up table and using the second measurement signal as an input. The gas signal may be calculated by the digital processor as an average value of the first and the second gas signal.

In an embodiment, the readout circuit provides a drift signal as a function of the first and the second measurement signal. The digital processor may perform the calculation of the drift signal. The digital processor may provide the drift signal as a function of the first and the second measurement signal and data stored in the memory.

In an embodiment, the digital processor may calculate the drift signal using the first and the second gas signals as inputs. The drift signal has a value indicating a drift, when the first gas signal is different from the second gas signal. The value of the drift signal may be a function of the difference between the first and the second gas signal, e.g. may be proportional to said difference.

In an embodiment, the readout circuit compares the first and the second measurement signal with correlation data stored in the memory. The readout circuit calculates the drift signal depending on the result of the comparison. If the first and the second measurement signal correlate to each other, the readout circuit may calculate a value of the drift signal indicating an absence of a drift. In case the first and the second measurement signal have only a small or none correlation, the readout circuit calculates the drift signal with a value indicating a drift.

In an embodiment, the sensor arrangement performs an offset correction, generates a warning signal and/or starts a regeneration cycle depending on the value of the drift signal. The readout circuit may be configured to compare the value of the drift signal with a threshold value and to generate the warning signal, to start the regeneration cycle and/or to perform the offset correction in case the drift signal is higher than the threshold value. Alternatively, the readout circuit may perform an offset correction for each value of the drift signal that indicates a drift.

In an embodiment, the capacitive sensor comprises a fourth electrode line. The sensitive layer is arranged at the fourth electrode line. The fourth electrode line is coupled to the readout circuit. The readout circuit is configured to generate the second measurement signal using the third and the fourth electrode lines. The converter may be coupled on its input side to the third and the fourth electrode lines.

In case the readout circuit comprises the converter and the further converter, the further converter is coupled on its input side to the third and fourth electrode lines. The converter is coupled on its input side to the first and second electrode lines.

In an embodiment, the sensitive layer is in contact with the fourth electrode line.

In an embodiment, the first, second, third and fourth electrode line are configured such that the first measurement signal depends more on a swelling of the sensitive layer than the second measurement signal.

In an embodiment, the first, second, third and fourth electrode line are configured such that the second measurement signal depends more on the bulk properties of the sensitive layer than the first measurement signal.

In an embodiment, a distance of the first and second electrode lines to an interface between the sensitive layer and an ambient gas is less than a distance of the third and fourth electrode lines to said interface. Thus, the first to the fourth electrode lines may be arranged in different planes. Thus, a change of a parameter at the interface can be detected by the first and second electrode lines and changes the first measurement signal to a higher extent than the second measurement signal. A change in the bulk of the sensitive layer can be more easily detected by the third and fourth electrode lines and, thus, changes the second measurement signal to a higher extent than the first measurement signal.

In an embodiment, the capacitive sensor comprises a semiconductor substrate and at least a dielectric layer on top of the semiconductor substrate. A distance of the first and second electrode lines to the semiconductor substrate is larger than a distance of the third and fourth electrode lines to the semiconductor substrate.

The third and the fourth electrode lines may be covered by the sensitive layer. The third and fourth electrode lines may each have a top surface that is covered by the sensitive layer. The third and fourth electrode lines may have side surface that are covered by the sensitive layer. The first to the fourth electrode lines are arranged side-by-side on the dielectric layer.

In an alternative embodiment, the first electrode line is arranged on top of the third electrode line. Correspondingly, the second electrode line is arranged on top of the fourth electrode line. A further dielectric layer is arranged between the first and the third electrode lines and between the second and the fourth electrode lines. The further dielectric layer may also be named separating dielectric layer. The first and the second electrode line are stacked above the third and the fourth electrode line. The third and the fourth electrode line are arranged side-by-side on the dielectric layer.

In an embodiment, the first and the second electrode lines are covered by the sensitive layer.

In an alternative embodiment, the first and the second electrode lines are only partially covered by the sensitive layer. For example, the top surface of the first and the second electrode line may be free from the sensitive layer. For example, only a part of the side surfaces of the first and second electrode line may be in contact with the sensitive layer.

In an embodiment, an interface of the sensitive layer and the ambient air is below the top surface and above a bottom surface of the first and second electrode lines. Optionally, said interface may be in the midst of the top surface and the bottom surface. Thus, said interface may be in the midst of the side surfaces of the first and second electrode lines.

In an embodiment, the sensitive layer may not be perfectly flat. A thickness of the sensitive layer may be higher adjacent to the first and second electrode lines than in an area between the first and the second electrode lines. However, an average thickness of the sensitive layer and an average interface of the sensitive layer to the ambient air can be defined. Thus, an average interface of the sensitive layer to the ambient air is below the top surface and above the bottom surface of the first and second electrode lines.

In an embodiment, the first, the second and the third electrode lines are arranged in a plane. A distance of the first, the second and the third electrode lines to a semiconductor substrate of the capacitive sensor is approximately identical.

In an embodiment, a distance of the first electrode line to the second electrode line is larger than a distance of the first electrode line to the third electrode line. The readout circuit generates the first measurement signal by a capacitance measurement between the first and the second electrode line. Moreover, the readout circuit generates the second measurement signal by a capacitance measurement between the first and the third electrode line.

In an embodiment, the first and the second electrode lines are coupled to the converter in a first phase and the first and the third electrode line are coupled to the converter in a second phase. Due to the small distance of the first electrode line to the third electrode line, the second measurement signal depends more on the bulk parameter of the sensitive layer than the first measurement signal. Due to the larger distance of the first electrode line to the second electrode line, the first measurement signal depends more on parameters at the surface of the sensitive layer than the second measurement signal.

In an embodiment, the capacitive sensor comprises a transducer layout configured to track permanent material changes, such as permanent changes of the sensitive layer.

The sensor arrangement may perform active cancellation of sensor drift.

The sensor arrangement may track differences in capacitive readout due to material changes (i.e. swelling) and bulk dielectric constant changes, thus detecting and decoupling drift (or permanent capacitive change) from regular dielectric changes. Thus, the sensor arrangement is able to counteract a drift in the sensitive layer. Sensor drift can often be attributed to bulk effects of the sensitive layer that is also called material or gas sensitive layer.

The sensor arrangement may use at least two material properties to determine the gas concentration or the relative humidity. As a result, the accuracy of the sensor read-out increases. The sensor arrangement may able to identify when a recovery treatment is required. Such a recovery treatment may return the material, e.g. the sensitive layer, to its original state.

The sensor arrangement may include tracking whether permanent changes in the relative humidity sensitive bulk material occur. The sensor arrangement may include to identify drift to initiate countermeasures to these effects. The sensor arrangement simultaneously monitors multiple types of drift (permanent swelling and dielectric constant drift) in the gas sensitive material and determines the conditions for initiating countermeasures. The sensor arrangement identifies drift and triggers a warning or on-chip countermeasures.

The sensor arrangement may be designed to track two different material properties by two capacitive measurements. This is realized by adjusting the transducer layout (including different electrode sets) or/and by applying different electrode polarization on the same electrode set.

The sensor arrangement may be designed to identify drift. The two capacitive measurements are compared continuously. Ideally, a correlation plot or correlation data between relative humidity—(reversible) swelling—(reversible) dielectric constant exists. If irreversible swelling occurs, the dimensional material changes will not correspond any more with dielectric constant changes according to the pre-drift correlation. The double capacitive measurement of the sensor arrangement identifies the deviation from this correlation.

The sensitive layer may be a polymer material or out of other material classes such as metal-organic frameworks, abbreviated MOF, or ionic liquids. The sensitive layer may be designed for capacitive measurement or capacitive gas sensing.

In an embodiment, the sensor arrangement independently obtains information from the polymer thickness and the polymer bulk dielectric constant. To achieve this with a capacitive measurement, the thickness of the polymer and the spacing of the electrode lines are carefully matched. The capacitive thickness measurement makes use of electric field lines that extend beyond the air-polymer interface. For example, the distance between the electrodes lines and the polymer-air interface should be less than three times the spacing of the electrode lines (rule of thumb). The opposite is true for the electrodes lines measuring the polymer dielectric properties: The distance to the air-polymer interface should be further than three times the spacing of the electrode lines.

In an embodiment, the sensor arrangement may track permanent material changes via the use of two different sets of electrodes lines (with different distances to the air/polymer interface) or/and via changing the electrode configuration. Polymer swelling and especially permanent polymer swelling typically only displaces the air/polymer interface by a very small amount, typically a few nanometer. An electrode configuration which is not fully covered by the polymer is more sensitive to detect this change in comparison to an electrode configuration which is fully covered by the polymer. Therefore, the air/polymer interface may be placed in the most sensitive part of the electrode configuration, e.g. halfway the electrode height. Thus, the sensor arrangement may be able to detect any (permanent) swelling of the polymer layer.

In an embodiment, a method for generating measurement signals comprises generating a first measurement signal using a first and a second electrode line of a capacitive sensor by a readout circuit. Moreover, a second measurement signal is generated using at least a third electrode line of the capacitive sensor by the readout circuit. The capacitive sensor comprises a sensitive layer that is arranged at the first, second and third electrode lines. The readout circuit comprises a capacitance-to-digital converter.

Advantageously, by using three different electrode lines in combination with one sensitive layer, different parameters of the sensitive layer can be detected by the readout circuit.

BRIEF DESCRIPTION OF THE DRAWINGS

The following description of figures of exemplary embodiments may further illustrate and explain aspects of the invention. Elements, layers and circuit blocks with the same structure and the same effect, respectively, appear with equivalent reference symbols. In so far as elements, layers and circuit blocks correspond to one another in terms of their function in different figures, the description thereof is not repeated for each of the following figures.

FIGS. 2A to 2D show further exemplary embodiments of a capacitive sensor;

FIGS. 4A to 4C show a further exemplary embodiment of a sensor arrangement;

DETAILED DESCRIPTION

Figure 1A:
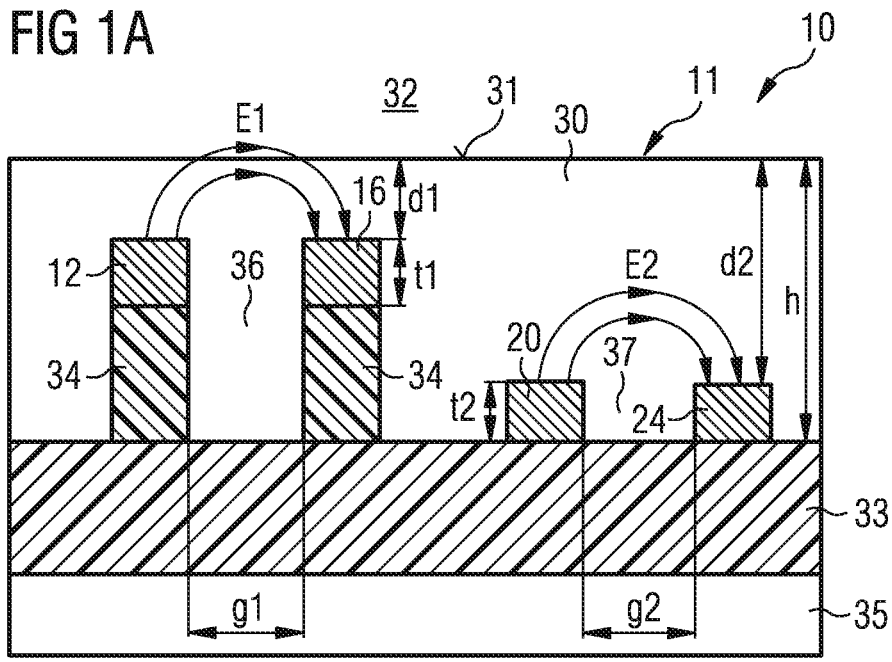
FIGS. 1A and 1B show an exemplary embodiment of a sensor arrangement with a capacitive sensor.

FIG. 1A shows an exemplary embodiment of a capacitive sensor 11 of a sensor arrangement 10. The capacitive sensor 11 comprises a first electrode line 12, a second electrode line 16 and a third electrode line 20. Moreover, the capacitive sensor 11 comprises a fourth electrode line 24. The capacitive sensor 11 comprises a sensitive layer 30. The sensitive layer 30 has an interface 31 to an ambient gas 32. The ambient gas 32 comprises the parameter to be detected, such as water molecules or another target gas. The sensitive layer 30 may be a polymer, such as a polyimide.

The first and the second electrode line 12, 16 have a first distance d1 to the interface 31 between the sensitive layer 30 and the ambient gas 32. Similarly, the third and the fourth electrode line 20, 24 have a second distance d2 to the interface 31. The second distance d2 is larger than the first distance d1. In an example, the first distance d1 may have a value of 1 µm and the second distance d2 may have a value of 4 µm. The first and second electrode lines 12, 16 have a first thickness t1. The third and fourth electrode lines 20, 24 have a second thickness t2. The first and the second thickness t1, t2 may be, for example, out of an interval from 0.1 µm to 2 µm. Optionally, the first and the second thickness t1, t2 may equal. Optionally, the first and the second thickness t1, t2 may be 1 µm.

A first gap 36 between the first and the second electrode line 12, 16 may have a first width g1. Similarly, a second gap 37 between the third and the fourth electrode line 20, 24 may have a second width g2. In an example, the first width g1 is equal to the second width g2. The first width g1 and the second width g2 may be out of an interval between 0.1 µm to 20 µm. For example, the first and the second width g1, g2 may each be 1 µm. In an example, the electrode lines 12, 16, 20, 21 may have an identical width.

The capacitive sensor 11 comprises a dielectric layer 33. The first to the fourth electrode lines 12, 16, 20, 24 are arranged on top of the dielectric layer 30. The third and the fourth electrode lines 20, 24 are directly arranged on the dielectric layer 33. The capacitive sensor 11 comprises a further dielectric layer 34 that is arranged between the dielectric layer 33 and the first and the second electrode lines 12, 16.

The sensitive layer 30 covers the top surface of the third and the fourth electrode lines 20, 24. The sensitive layer 16 also covers the side surfaces of the third and the fourth electrode lines 14, 15. Correspondingly, the sensitive layer 16 covers the top surfaces of the first and the second electrode lines 12, 16. Moreover, the sensitive layer 30 also covers the side surfaces of the first and the second electrode lines 12, 16. The sensitive layer 30 fills the first and the second gap 36, 37.

Additionally, the capacitive sensor 11 comprises a semiconductor substrate 35 on which the dielectric layer 33 is arranged. Thus, the capacitive sensor 11 comprises a first stack comprising the third electrode line 20, the dielectric layer 19 and the semiconductor substrate 21. Additionally, the capacitor sensor 11 comprises a second stack comprising the first electrode line 12, the further dielectric layer 34, the dielectric layer 33 and the semiconductor substrate 35. The dielectric layer 33 and/or the further dielectric layer 34 may be realized as inter-metal dielectric layers.

Electric field lines E1 run from the first electrode line 12 to the second electrode line 16 and are generated by applying different voltages to the first and the second electrode lines 12, 16. The electric field lines E1 extend mainly through the sensitive layer 30 but also extend through the ambient gas 32. Thus, some of the electric field lines E1 cross the interface 31. Electric field lines E2 extend from the third to the fourth electrode line 20, 24. The electric field lines E2 completely run through the sensitive layer 30. The electric field lines E2 do not touch the interface 31 or the ambient gas 32.

The first electrode line 12 is free of an electric conductive connection to the second electrode line 16. The third electrode line 20 is free of an electric conductive connection to the fourth electrode line 24. The first and the second electrode lines 12, 16 are also free from an electrical conducting connection to the third and the fourth electrode lines 20, 24.

Alternatively, one of the first and the second electrode lines 12, 16 is electrically connected to one of the third and fourth electrode lines 20, 24. For example, the second and the fourth electrode lines 16, 24 may be both connected to a common terminal such as a reference potential terminal at which a reference potential is provided.

In FIG. 1A, a cross-section of the capacitive sensor 11 is shown. In the capacitive sensor 11, a first electrode set 12, 16 is dedicated to track permanent dimensional changes and a second separate electrode set 20, 24 is dedicated to track dielectric constant changes. The first electrode set 12, 16 is physically located closer to the air-polymer interface 31 than the second electrode set 20, 24 to capture dimensional effects. The capacitive sensor 11 tracks dimensional changes in the polyimide 30 using two different electrode pairs. The polyimide-air interface 31 moves in the fringe field of the first electrode set 12, 16, also called first electrode pair.

Optionally, the first width g1 and the first distance d1 are set according to the following equation:

$$g1 \cdot N > d1,$$

wherein N may be 3. Alternatively, N may be 1 or 2.

Optionally, the second width g2 and the second distance d2 are set according to the following equation:

$$g2 \cdot M > d2,$$

wherein M may be 3. Alternatively, M may be 1 or 2.

In an alternative embodiment, not shown, the sensitive layer 30 only covers a part of the side surfaces of the first and the second electrode lines 12, 16 and does not cover the top surfaces of the first and the second electrode lines 12, 16.

In an alternative embodiment, not shown, a metallization stack may be arranged between the semiconductor substrate 35 and the dielectric layer 33. The metallization stack may comprise at least one further metallization layer and one further dielectric layer.

Figure 1B:
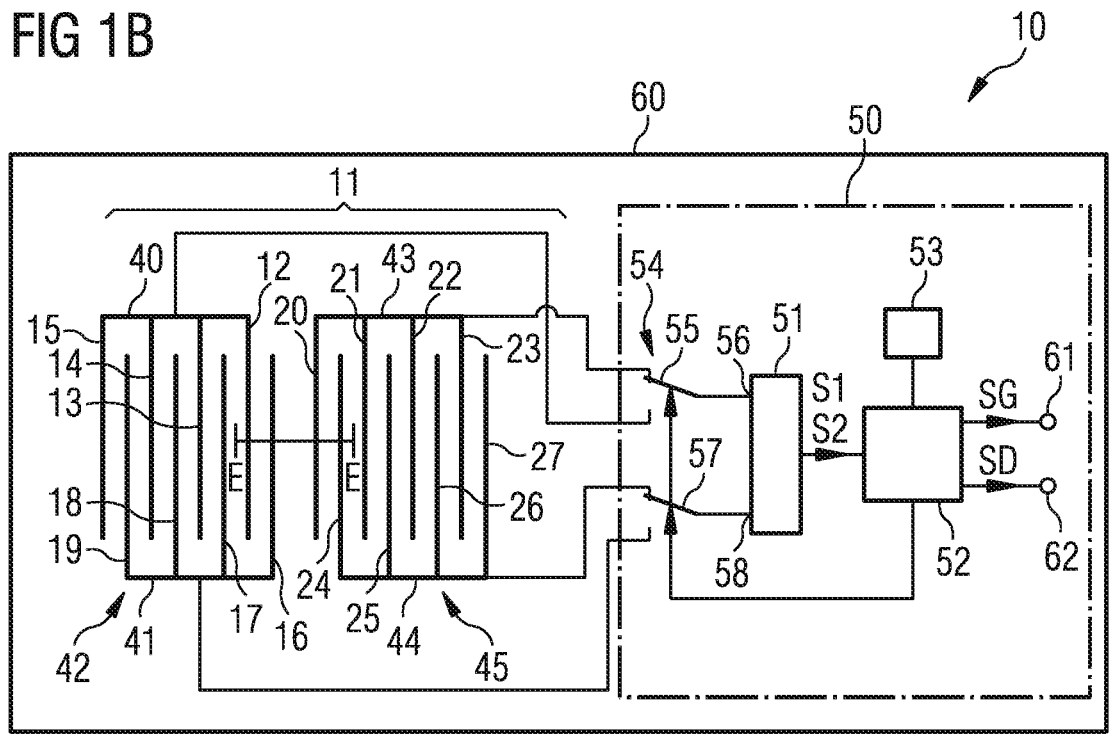

FIG. 1B shows an exemplary embodiment of the sensor arrangement 10 comprising the capacitive sensor 11. FIG. 1A shows the cross-section of a part of the capacitive sensor 11 marked with EE in FIG. 1B. The first electrode line 12 is electrically connected to further first electrode lines 13 to 15 of the capacitive sensor 11. The first electrode line 12 and the further first electrode lines 13 to 15 run parallel to each other. The first electrode line 12 and the further first electrode lines 13 to 15 form a first interdigitated electrode 40.

Correspondingly, the second electrode line 16 is electrically connected to further second electrode lines 17 to 19 of the capacitive sensor 11. The second electrode line 16 and the further second electrode lines 17 to 19 run parallel to each other. The second electrode line 16 and the further second electrode lines 17 to 19 form a second interdigitated electrode 41. The first and the second interdigitated electrode 40, 41 form a first interdigitated capacitor 42.

Moreover, the capacitive sensor 11 comprises further third electrode lines 21 to 23 that are electrically connected to the third electrode line 20. The third electrode line 20 and the further third electrode lines 21 to 23 run parallel to each other. The third electrode line 20 and the further third electrode lines 21 to 23 form a third interdigitated electrode 43.

Correspondingly, the fourth electrode line 24 is electrically connected to further fourth electrode lines 25 to 27 of the capacitive sensor 11. The fourth electrode line 24 and the further fourth electrode lines 25 to 27 run parallel to each other. The fourth electrode line 24 and the further fourth electrode lines 25 to 27 form a fourth interdigitated electrode 44. The third and the fourth interdigitated electrode 43, 44 form a second interdigitated capacitor 45.

The first electrode line 12 and the further first electrode lines 13 to 15 are abbreviated as first electrode lines 12 to 15 in the following text. Correspondingly, second electrode lines 16 to 19, third electrode lines 20 to 23 and fourth electrode lines 24 to 27 are defined.

The sensor arrangement 10 comprises a readout circuit 50 that is electrically coupled to the first electrode lines 12 to 15, the second electrode lines 16 to 19, the third electrode lines 20 to 23 and the fourth electrode lines 24 to 27.

The readout circuit 50 comprises a capacitance-to-digital converter 51, abbreviated converter. The converter 51 is electrically coupled to the first, second, third and fourth electrode lines 12 to 27. Moreover, the readout circuit 50 comprises a digital processor 52 that is coupled on its input side to the converter 51. The readout circuit 50 comprises a memory 53 that is coupled to the digital processor 52.

Furthermore, the readout circuit 50 comprises a switching arrangement 54. A control input of the switching arrangement 54 is coupled to an output of the digital processor 52. The switching arrangement 54 comprises a first changeover switch 55 having a first input connected to the first electrode lines 12 to 15 and a second input connected to the third electrode lines 20 to 23 and an output connected to a first input 56 of the converter 51. The switching arrangement 54 may comprise a second changeover switch 57 with a first input connected to the second electrode lines 16 to 19, a second input connected to the fourth electrode lines 24 to 27 and an output connected to a second input 58 of the converter 51.

The sensor arrangement 10 comprises a semiconductor body 60. The capacitive sensor 11 and the readout circuit 50 are part of the semiconductor body 60. Thus, the semiconductor substrate 35, shown in FIG. 1A, is used for the realization of the readout circuit 50.

In a first phase A, the first electrode lines 12 to 15 are coupled to the first input 56 of the converter 51 via the first changeover switch 55. The second electrode lines 16 to 19 are electrically coupled via the second changeover switch 57 to the second input 58 of the converter 51. The converter 51 generates a first measurement signal S1. Thus, the first measurement signal S1 is generated using the first and the second electrode lines 12 to 19. The first measurement signal S1 is a function of the capacitance between the first electrode lines 12 to 15 and the second electrode lines 16 to 19.

In a second phase B, the third electrode lines 20 to 23 are coupled via the first changeover switch 55 to the first input 56 of the converter 51. The fourth electrode lines 24 to 27 are coupled via the second changeover switch 57 to the second input 58 of the converter 51. The converter 51 generates a second measurement signal S2. Thus, the second measurement signal S2 is generated using the third and the fourth electrode lines 20 to 27. The second measurement signal S2 is a function of the capacitance between the third electrode lines 20 to 23 and the fourth electrode lines 24 to 27. The first and the second measurement signals S1, S2 are provided to the digital processor 52.

The digital processor 52 generates a gas signal SG at a first output 61. The gas signal SG may be realized as humidity signal. The humidity signal provides the information about the relative humidity in the ambient gas 32. The gas signal SG may be determined by the digital processor 52 using the first and the second measurement signals S1, S2. Moreover, the digital processor 52 generates a drift signal SD at a second output 62. The drift signal SD may be determined by the digital processor 52 using the first and the second measurement signals S1, S2.

The digital processor 52 uses data stored in the memory 53 for providing the gas signal SG and the drift signal SD. The memory 53 may store parameters of functions or a look-up table which are used for the calculation of the gas signal SG and the drift signal SD using the first and the second measurement signal S1, S2 as inputs. The parameter of the functions or the look-up table may be stored in a non-volatile block of the memory 53 such as an electrically erasable programmable read only memory, abbreviated EEPROM, or a one-time programmable memory, abbreviated OTP.

The first and the second measurement signal S1, S2 are alternatively generated. Since the first and the second measurement signal S1, S2 are generated in separate phases, namely the first and the second phase A, B, they are generated at separate points of time and the digital processor 52 may store intermediate values in a volatile block of the memory 53. The first and the second phase A, B are periodically repeated.

The sensor arrangement 10 identifies the drift by comparing the gas measurement to a prior stored gas correlation plot or the relative humidity measurement to a prior stored relative humidity correlation plot.

In order to detect permanent swelling off-sets, the ratio of both measured values is known for "normal"—reversible conditions (determined by the correlation curve before drift). For each dielectric constant value, a fixed amount of swelling is expected. Permanent changes are detected when the ratio $\Delta h/\Delta \varepsilon$ deviates from the calibrated values. The sensor arrangement 10 applies a compensation which could be an off-set correction, a warning signal from the sensor arrangement 10 and/or a regeneration cycle.

The first measurement signal S1 is mainly a function of the height h and of the dielectric constant $\varepsilon$ of the sensitive layer 30 and the second measurement signal S2 is mainly a function of the dielectric constant $\varepsilon$ of the sensitive layer 30. Both the height h and the dielectric constant $\varepsilon$ depend on the gas concentration to be measured or, in case of humidity sensing, on the relative humidity in the ambient gas 32. In an example, the drift signal SD may indicate the absence of a drift, when a predetermined value of the second measurement signal S2 can be measured at a measured value of the first measurement signal S1. When at the measured value of the first measurement signal S1, the predetermined value of the second measurement signal S2 differs from the actual measured value of the second measurement signal S2, than the drift signal SD may indicate a drift.

In an alternative embodiment, not shown, the output of the second changeover switch 57 is connected to a reference potential terminal.

In an alternative embodiment, not shown, the second and the fourth electrode lines 16 to 19, 24 to 27 are directly connected to a reference potential terminal. The second changeover switch 57 is omitted.

FIG. 2A shows a further exemplary embodiment of the capacitive sensor 11 of the sensor arrangement 10 which is a further development of the embodiments shown in FIGS. 1A and 1B. The first electrode line 12 is arranged on top of the third electrode line 20. Correspondingly, the second electrode line 16 is arranged on top of the fourth electrode line 24. The further dielectric layer 34 is arranged between the first and the third electrode lines 12, 20 and between the second and the fourth electrode lines 16, 24. The further dielectric layer 34 has a layer thickness t3.

In FIG. 2A, a cross-section is shown. The first to the fourth electrode lines 12, 16, 20, 24 are stacked. Thus, the capacitive sensor 11 comprises a first stack 70 comprising the first electrode line 12, the further dielectric layer 34, the third electrode line 20, the dielectric layer 33 and the semiconductor substrate 35. Correspondingly, the capacitive sensor 11 comprises a second stack 71 comprising the second electrode line 16, the further dielectric layer 34, the fourth electrode line 24, the dielectric layer 33 and the semiconductor substrate 35.

Contrary to FIG. 1A, the first and the second electrode lines 12, 16 are not completely covered by the sensitive layer 30. Thus, the top surfaces of the first and the second electrode lines 12, 16 are free from the sensitive layer 30. The sensitive layer 30 only covers a part of the side surfaces of the first and the second electrode lines 12, 16. The interface 31 is at the height of the side surfaces of the first and the second electrode lines 12, 16.

The capacitive sensor 11 may comprise the further first electrode lines 13 to 15, the further second electrode lines 17 to 19, the further third electrode lines 21 to 23 and the further fourth electrode lines 25 to 27 that are connected to the first, second, third and fourth electrode lines 12, 16, 20, 24. Thus, the second interdigitated capacitor 45 is realized between the first interdigitated capacitor 42 and the dielectric layer 33. The first interdigitated capacitor 42 is realized on top of the second interdigitated capacitor 45. The first and the second interdigitated capacitors 42, 45 are separated by the further dielectric layer 34. Advantageously, an area for the realization of the capacitive sensor 11 is reduced in comparison to the embodiment shown in FIG. 1A. The capacitive sensor 11 realizes a vertical integration of the electrode lines 12 to 27. The two separate electrode sets are vertically implemented in the capacitive sensor 11. The capacitive sensor 11 aims for a high sensitivity to dimensional changes.

FIG. 2B shows the capacitive sensor 11 as illustrated in FIG. 2A in the first and the second phase A, B. In the first phase A shown on the left side of FIG. 2B, the readout circuit 50 provides a driving signal S to the first electrode line 12 and a reference potential G to the second electrode line 16. The second electrode line 16 is grounded. The first electrode line 12 is marked with an S and the second electrode line 16 is marked with a G. Moreover, the third and the fourth electrode lines 20, 24 are floating. Thus, the third and the fourth electrode lines 20, 24 are marked with an F. On the right side of FIG. 2B, the capacitive sensor 11 is shown in the second phase B. In the second phase B, the first and the second electrodes 12, 16 are kept floating. The readout circuit 50 applies the driving signal S to the third electrode 20 and the reference potential G to the fourth electrode 24.

Figure 2C:
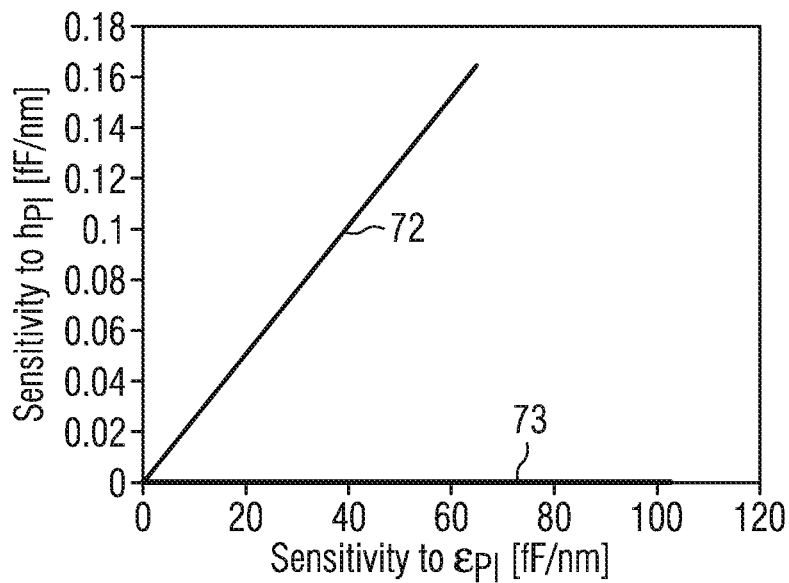

FIG. 2C shows an exemplary embodiment of simulated results of the capacitive sensor 11 shown in FIGS. 2A and 2B. The simulation curve 72 shows the sensitivity to the height h of the sensitive layer 30 versus the sensitivity to the dielectric constant ε using the first and the second electrode line 12, 16. Correspondingly, the second simulation curve 73 shows the sensitivity to the height h versus the sensitivity to the dielectric constant ε of the third and the fourth electrode lines 20, 24. According to the simulation, the third and the fourth electrode lines 20, 24 are only sensitive to changes of the dielectric constant ε of the sensitive layer 30, whereas the first and the second electrode lines 12, 16 are sensitive to the height h and to the dielectric constant ε of the sensitive layer 30.

The feasibility of the capacitive sensor 11 was investigated with finite element simulation. The model parameters were taken to mimic the transducer dimensions for both the swelling (top electrode pair 40, 41) and dielectric (electrode pair 43, 44 buried in polyimide) capacitive transducers as displayed in FIGS. 2A and 2B. For this case, the polymer thickness h is chosen to obtain a maximum sensitivity of the top electrode pair 40, 41 to polymer thickness changes.

The calculated capacitive changes are shown in FIG. 2C: The sensitivity of the two different electrode sets, namely the top and the buried electrode pair to swelling of the polymer in fF per nm compared to dielectric constant sensitivity is shown. The capacitance of the top electrode lines 12, 16 shows a clear dependence on both polymer swelling and dielectric constant changes, while the capacitance of the buried (bottom) electrode lines 20, 24 is nearly exclusively dependent on polymer dielectric constant. For the modeled transducer layout and polymer thickness, the sensitivity of 0.1 fF per nm is equivalent to 0.1 to 0.3% relative humidity per nm. The sensitivity of the capacitance-to-digital converter 51 is considered large enough for detecting sub-nm thickness changes to a significant level. The sensitivity to swelling is smaller for fully covered top electrodes lines 12, 16.

The following model parameters were used for finite element calculation: Width w and height t1, t2 of the electrode lines: 0.5μ·1.0 μm; electrode spacing: 1.0 μm horizontal, 1.0 μm vertical; polyimide height h: varying, nominal position halfway the first electrode layer (that is the middle of the side surface of the first electrode line 12). The task of the simulation was to solve for sensitivity to changes in the polyimide height $h_{PI}$: $\delta C/\delta h_{PI}$ in [fF/nm] and changes in the dielectric constant ε: $\delta C/\delta \varepsilon_{PI}$ for both top and second (buried) electrode configuration.

Figure 2D:
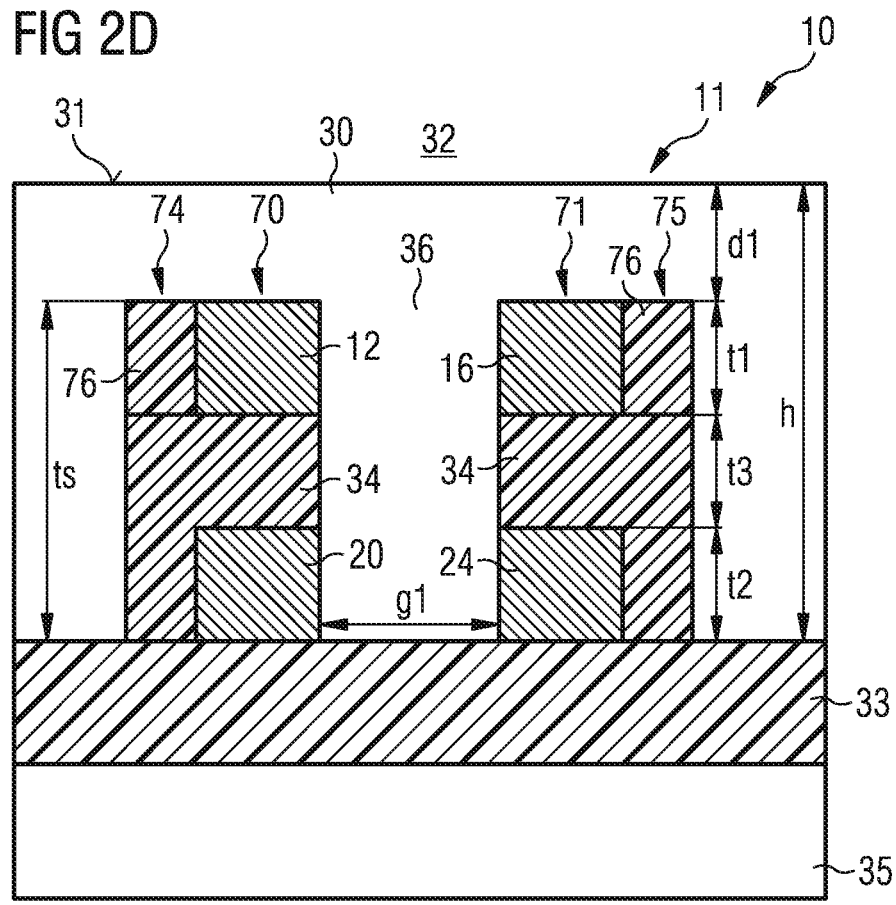

FIG. 2D shows a further exemplary embodiment of the capacitive sensor 11 that is a further development of the embodiments shown in FIGS. 1A, 1B, 2A and 2B. Similar to FIG. 2A, the first electrode line 12 is arranged above the third electrode line 20, wherein the further dielectric layer 34 separates the first and the third electrode lines 12, 20. Correspondingly, the second electrode line 16 is arranged above the fourth electrode line 24, whereas the further dielectric layer 34 separates the second and the fourth electrode lines 16, 24. Thus, the further dielectric layer 34 can be realized as separating dielectric layer.

The capacitive sensor 11 comprises a first dielectric layer stack 74 that is arranged on one side of the first stack 70. Thus, only one side surface of the first electrode line 12 and one side surface of the third electrode line 20 are covered by the first dielectric layer stack 74. Correspondingly, the capacitive sensor 11 comprises a second dielectric layer stack 75 that is arranged at the third and the fourth electrode lines 16, 24. Only one side surface of the third electrode line 16 and one side surface of the fourth electrode line 24 are covered by the second dielectric layer stack 75. The first and the second dielectric layer stack 74, 75 are formed by the further dielectric layer 34 and an additional dielectric layer 76.

The first gap 36 between the first and the second stack 70, 71 is filled by the sensitive layer 30. The sensitive layer 30 in the first gap 36 is in direct contact with the side surfaces of the first, second, third and fourth electrode lines 12, 16, 20, 24. The top surfaces of the first and the second electrode lines 12, 16 are covered by the sensitive layer. The sensitive layer 30 has the first distance d1 between the top surfaces of the first and the second electrode lines 12, 16 and the interface 31. The first distance d1 may be in an interval of 0.1 μm to 5 μm or from 0.2 μm to 2 μm. For example, the first distance d1 is 1 μm.

The capacitive sensor 11 may perform a residual passivation and may be suitable for a less ideal polymer deposition.

In an alternative embodiment, not shown, the top surfaces of the first and the second electrode lines 12, 16 are free from the sensitive layer 30. The sensitive layer 30 may have a height as shown in FIGS. 2A and 2B.

FIGS. 3A to 3F show an exemplary embodiment of a process for fabricating the capacitive sensor 11 of the sensor arrangement 10. The result of the process is a capacitive sensor 11 similar to the capacitive sensor shown in FIGS. 2A and 2B. However, also the capacitive sensor 11 shown in FIGS. 1A, 1B, 2D, 4A to 4C can also be fabricated by the process illustrated in FIGS. 3A to 3F after some minor modifications.

Figure 3A:
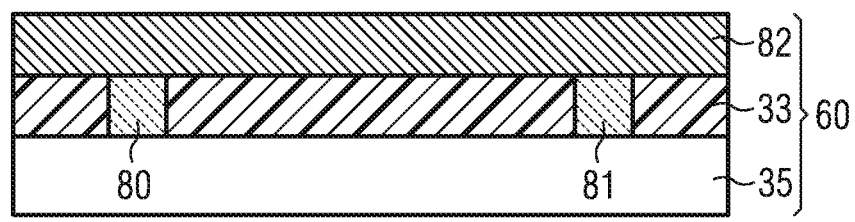
FIGS. 3A to 3F show an exemplary process for fabrication of a capacitive sensor.

As shown in FIG. 3A, the process starts with the semiconductor body 60 having the semiconductor substrate 35.

The semiconductor substrate 35 has the form of a wafer. The semiconductor substrate 35 is covered by the dielectric layer 33. The semiconductor substrate 35 may comprise an integrated circuit such as the readout circuit 50 shown in FIGS. 1B and 4C. The readout circuit 50 may be realized as a complementary metal oxide semiconductor circuit, abbreviated CMOS circuit. Thus, the semiconductor substrate 35 may comprise, not shown, at least a well and diffusion regions for source and drain regions of field-effect transistors. Between the dielectric layer 33 and the semiconductor substrate 35 a metallization stack, not shown, may be arranged. The metallization stack may comprise at least a metallization layers, e.g. made of polysilicon, a silicide or a metal, and at least a dielectric layer. The dielectric layer or layers separate the metallization layers from each other and from the semiconductor substrate 35.

The dielectric layer 33 may be, for example, a silicon nitride or silicon dioxide layer. A metallization layer 82 is deposited on the dielectric layer 33. The metallization layer 82 may be called metal 1. The metallization layer 82 may be made out of aluminum, copper, tungsten, platinum or another metal. Vias 81, 81 are arranged between the metallization layer 82 and the semiconductor substrate 35 or a metallization layer of the not shown metallization stack.

Figure 3B:
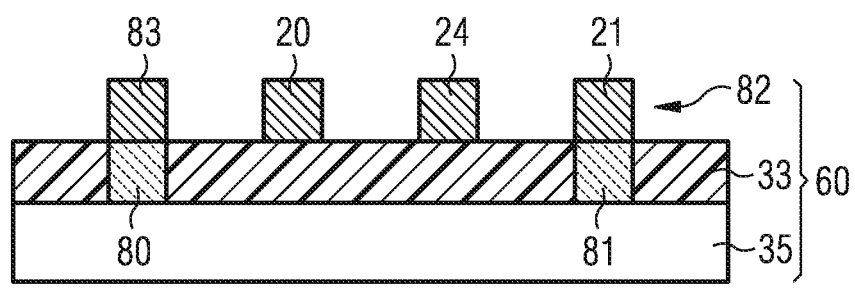

As shown in FIG. 3B, the metallization layer 82 is patterned. The third, the fourth and a further third electrode lines 20, 24, 21 are realized by etching the metallization layer 82. Moreover, a contact line 83 is realized by etching of the metallization layer 82. The contact line 83 is arranged on top of the via 80. The further third electrode line 21 is in contact to the via 81.

Figure 3C:
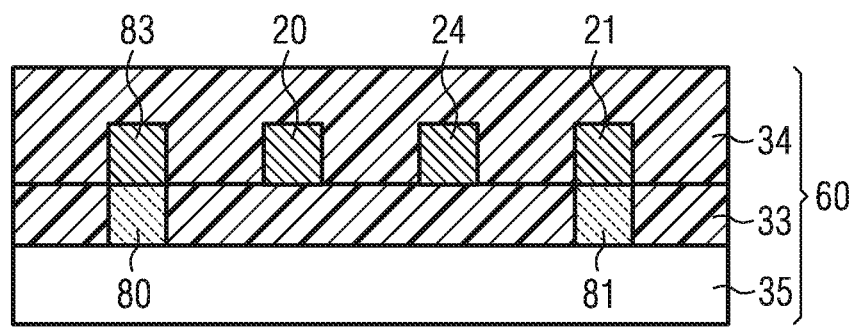

As illustrated in FIG. 3C, the further dielectric layer 34 is deposited. The further dielectric layer 34 may be called intermetal dielectric layer. The further dielectric layer 34 may be made of silicon nitride or silicon dioxide. The further dielectric layer 34 is deposited on the structures etched out of the metallization layer 82 and on the dielectric layer 33.

Figure 3D:
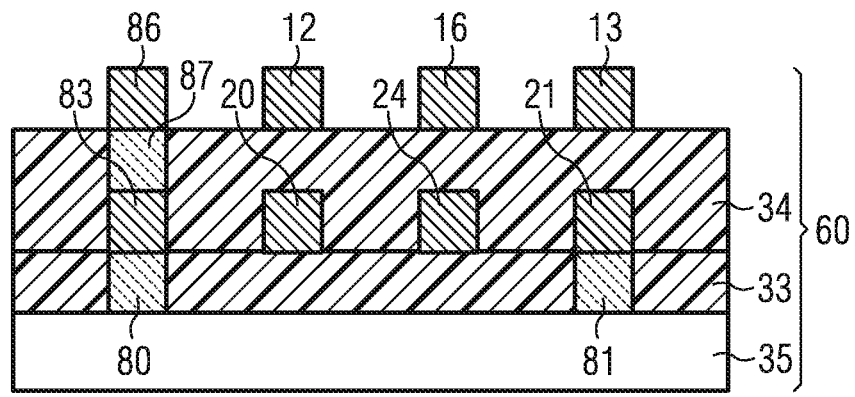

As shown in FIG. 3D, a further metallization layer 85 is deposited on the further dielectric layer 34 and patterned. The further metallization layer 85 may be called metal 2. The deposition and the patterning of the further metallization layer 85 may be realized similar to the deposition and patterning of the metallization layer 82. Thus, the first, the second and a further first electrode lines 12, 16, 13 are realized by the further metallization layer 85. Moreover, a connection line 86 is also made from the further metallization layer 85. The connection line 86 is arranged on top of a via 87 that is turn arranged on top of the contact line 83. Thus, the connection line 86 is electrically connected by the via 87, the contact line 83 and the via 80 to the semiconductor substrate 35 or to a metallization layer of the not shown metallization stack.

Thus, an electric connection is realized from the first electrode lines 12 to 15 and/or the second electrode lines 16 to 19 made of the further metallization layer 85 to the semiconductor substrate 35 or to a metallization layer of the not shown metallization stack. The third electrode lines 20 to 23 or/and the fourth electrode lines 24 to 27 made of the metallization layer 82 are electrically connected by the via 81 to the semiconductor substrate 35 or to a metallization layer of the not shown metallization stack.

Figure 3E:
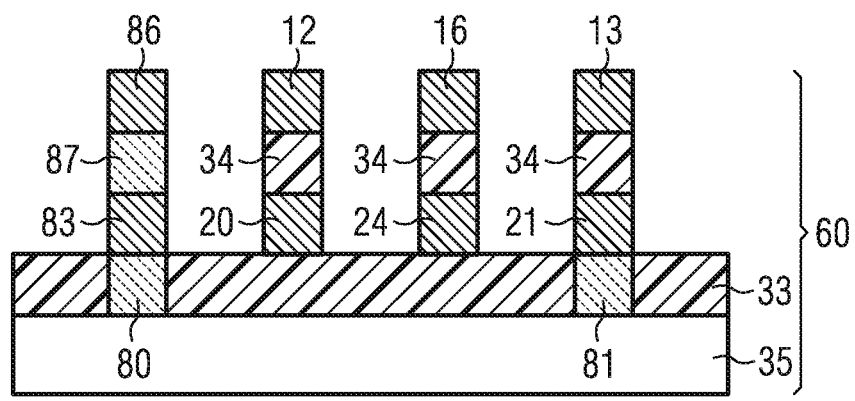

As illustrated in FIG. 3E, the further dielectric layer 34 is patterned. The etching process of the further dielectric layer 34 stops at the top surface of the dielectric layer 33. Moreover, the first to the fourth electrode lines 12 to 27 and the further dielectric layer 34 in the first and second stacks 70, 71 and in the further stacks are not removed.

Figure 3F:
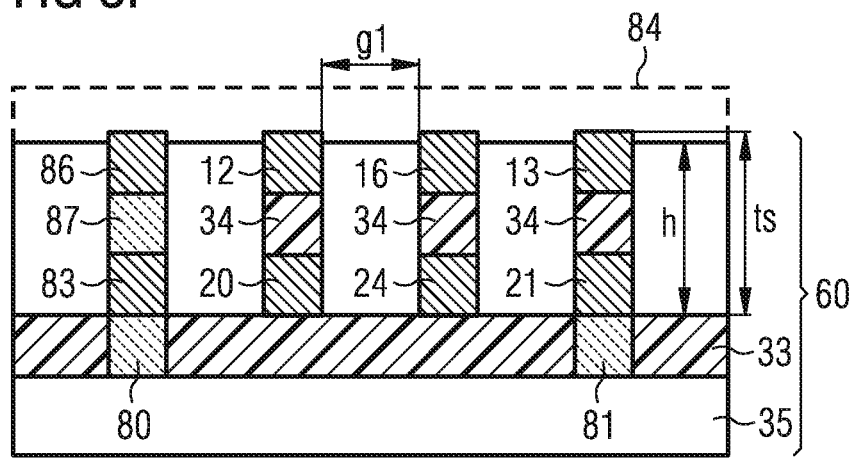

As illustrated in FIG. 3F, the sensitive layer 30 is deposited, e.g. by a spin-on process. The height h of the sensitive layer 30 is less than a stack height is of one of the first and second stacks 70, 71. Thus, the sensitive layer 30 does not cover the top surface of the first and the second electrode lines 12, 16.

Alternatively, the height h of the sensitive layer 30 may be larger than the stack height ts of the first stack 70. There may be a margin 84 in final polymer thickness, indicated by the broken line 84 in the polymer deposition step in FIG. 3F.

The capacitive sensor 11 may be fabricated via back-end processing. In order to fabricate the capacitive sensor 11 shown in the above mentioned figures, simultaneous processing of the top two metal layers 82, 85 is performed. In the example, two identical structures will be created in two different metal layers 82, 85. Two aligned electrode sets in two different metal layers 82, 85 may be fabricated by back-end processing as shown in FIGS. 3A to 3F.

The gaps 36 which are also be called trenches may have an aspect ratio larger than two: The stack height ts of the first gap 36 may be larger than two times of the first width g1 of the first gap 36. The polymer 30 is deposited in such a manner that trenches are filled which have an aspect ratio larger than two. Electrode spacing can be adjusted to accommodate for polymer deposition.

In an alternative embodiment, not shown, the capacitive sensor 11 is realized on an insulating substrate such as glass that replaces the dielectric layer 33 and the semiconductor substrate 35. The capacitive sensor 11 and the readout circuit 50 are realized on separate dies.

Figure 4A:
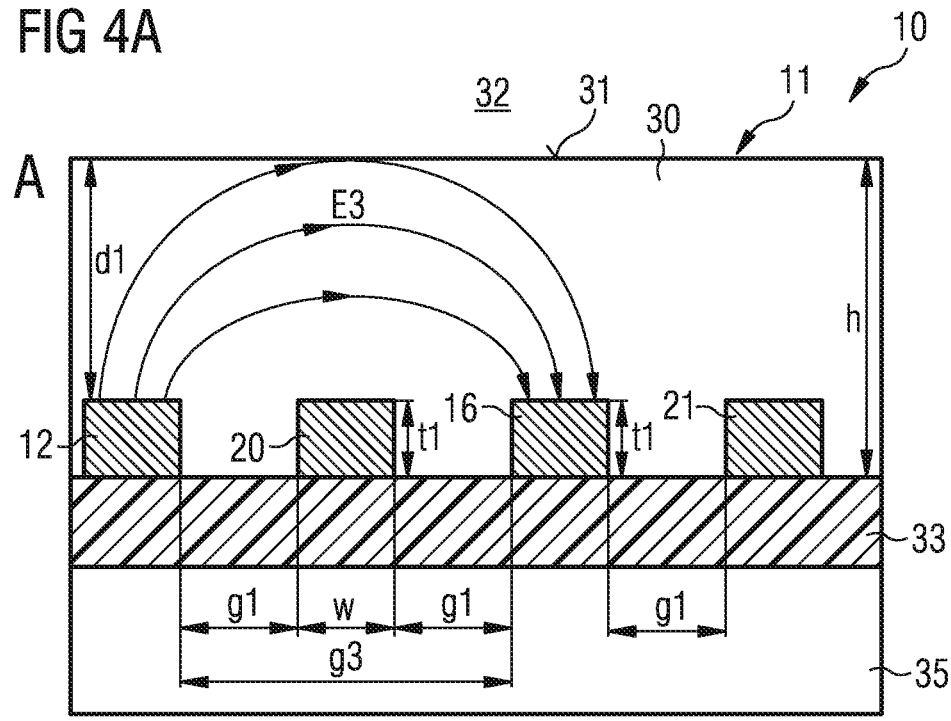

FIG. 4A shows a further exemplary embodiment of the capacitive sensor 11 of the sensor arrangement 10 that is a further development of the above-shown embodiments. The capacitive sensor 11 comprises the first, second and third electrode lines 12, 16, 20. Additionally, the capacitive sensor 11 comprises a further third electrode line 21. The third electrode line 20 is arranged between the first and the second electrode line 12, 16. The second electrode line 16 is arranged between the third and the further third electrode line 20, 21. The capacitive sensor 11 may be free of the fourth electrode line 24 or the fourth electrode lines 24 to 27.

In a not shown embodiment, the four electrode lines 12, 20, 16, 21 shown in FIG. 4A will be repeated. The four electrode lines 12, 20, 16, 21 of FIG. 4A form an elementary cell which is periodically repeated. Either one of the first electrode lines 12 to 15 or one of the second electrode lines 16 to 19 is between two of the third electrode lines 20 to 23. The number of the third electrode lines 20 to 23 is approximately equal to the sum of the first and the second electrode lines 12 to 19.

The sensitive layer 30 covers the first to the third electrode lines 12 to 23. Each of the first to the third electrode lines 12 to 23 is on the same plane. Each of the first to the third electrode lines 12 to 23 have the same distance d1 to the interface 31. Each of the first to the third electrode lines 12 to 23 is directly arranged on the dielectric layer 33.

In the first phase A, the third electrode line 20 and the further third electrode line 21 are kept floating. Electric field lines E3 are generated between the first and the second electrode line 12, 16. Due to the large distance g3 between the first and the second electrode line 12, 16, the electric field lines E3 have a high penetration depth inside the sensitive layer 30. The electric field lines E3 may be in contact with the interface 31. Thus, by the electric field lines E3, a change of a parameter of the sensitive layer 30 at the interface 31 can be detected.

Figure 4B:
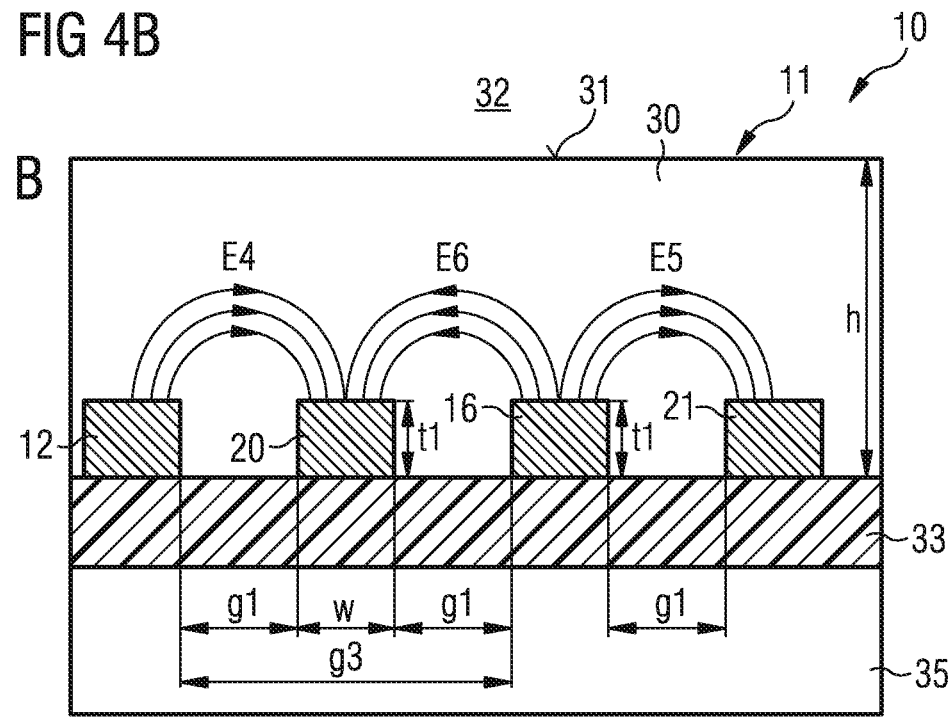

FIG. 4B shows the capacitive sensor 11 illustrated by FIG. 4A in the second phase B. In the second phase B, electrical field lines E4 to E6 are generated between the first and the third electrode lines 12, 20, between the second and the further third electrode lines 16, 21 and between the second and the third electrode line 16, 20. Thus, in the second phase B, the first and the second electrode lines 12, 16 may be coupled together. Due to the small distance g1 between the first and the third electrode line 12, 20, between the second and the third electrode line 16, 20 and between the second and the further third electrode line 16, 21, the electric field lines E4 to E6 have only a low penetration depth inside the sensitive layer 30. By the electric field lines E4 to E6 a change of a parameter in the bulk of the sensitive layer 30 can be measured.

FIG. 4C shows an exemplary embodiment of the sensor arrangement 10 that is a further development of the above-shown embodiments. The capacitive sensor 11 as shown in FIG. 4C is a schematic top view on the capacitive sensor 11 illustrated by FIGS. 4A and 4B. The readout circuit 50 is similar as shown in FIG. 1B. In FIG. 4C, the cross-section shown in FIGS. 4A and 4B is marked with DD. The third electrode lines 20 to 23 are arranged between the first and the second electrode lines 12 to 14, 16, 17. Thus, between one line of the first electrode lines 12 to 14 and one line of the second electrode lines 16, 17, in each case one line of the third electrode lines 20 to 23 is arranged. A line of the first electrode lines 12 to 14 has a large distance g3 to the neighboring line of the second electrode lines 16 to 17. A line of the first and the second electrode lines 12 to 14, 16, 17 only has a short distance g1 to the neighboring line of the third electrode lines 20 to 23.

The first electrode lines 12 to 14 may be directly and permanently connected to the first input 56 of the converter 51. The first changeover switch 55 has an input connected to the second electrode lines 16, 17, a first output connected to the first input 56 of the converter 51 and a second output connected to the second input 57 of the converter 51. The second changeover switch 57 has an input connected to the third electrode line 20 to 23 and a first output connected to the second input 58 of the converter 51. A second output of the second converter switch 57 is kept open.

Alternatively, the switching arrangement 54 comprises a switch 90 coupling the third electrode lines 20 to 24 to the second input 58 of the converter 51. The second changeover switch 57 may be omitted.

In the first and the second phase A, B, the first electrode lines 12 to 14 are permanently connected to the first input 56 of the converter 51. In the first phase A, the second electrode lines 16, 17 are coupled to the second input 57 of the converter 51 via the first changeover switch 55, and the third electrode lines 20 to 23 are kept floating. In the second phase B, the second electrode lines 16, 17 are coupled to the first input 56 of the converter 51 and the third electrode lines 20 to 23 are coupled to the second input 58 of the converter 51 via the first and the second changeover switch 55, 57.

Advantageously, the capacitive sensor 11 has different electric field lines E3 to E6 in the first and the second phase A, B and, thus, different parameters of the sensitive layer 30 can be measured in the first and the second phase A, B. The first and the second measurement signals S1, S2 are determined and further processed such as described above and shown in FIG. 1B.

The sensor arrangement 10 of FIGS. 4A to 4C uses a consecutive set of lateral electrode lines which can be biased differently. During bias in the second phase B, the electrodes lines measure the material 30 close to the electrode lines. When changing the bias in the transition from the second phase B to the first phase A, the effective spacing of the electrode lines is increased whereby the electric field lines E3 also probe the air-polymer interface 31.

The capacitive sensor 11 provides a lateral electrode configuration with different biasing. The electrical field lines E3, E4, E5 probe different parts of the material 30. In the second phase B, the material 30 close to the electrode lines is probed. In the first phase A, the material 30 and the air-polymer interface 31 are probed. The read-out circuit 50 includes switches to polarize the same electrode sets by two different biasing schemes.

In an alternative embodiment, not shown, the sensitive layer 30 has a smaller height h. The first distance d1 is set such that the electric field lines E3 in the first phase A extend to the ambient gas 32. The first distance d1 may be less than the first width g1 of the first gap 36 between two neighboring electrode lines 12, 16, 20, 21. In an example, the electrode lines 12, 16, 20, 21 may have the identical width w.

Figure 5A:
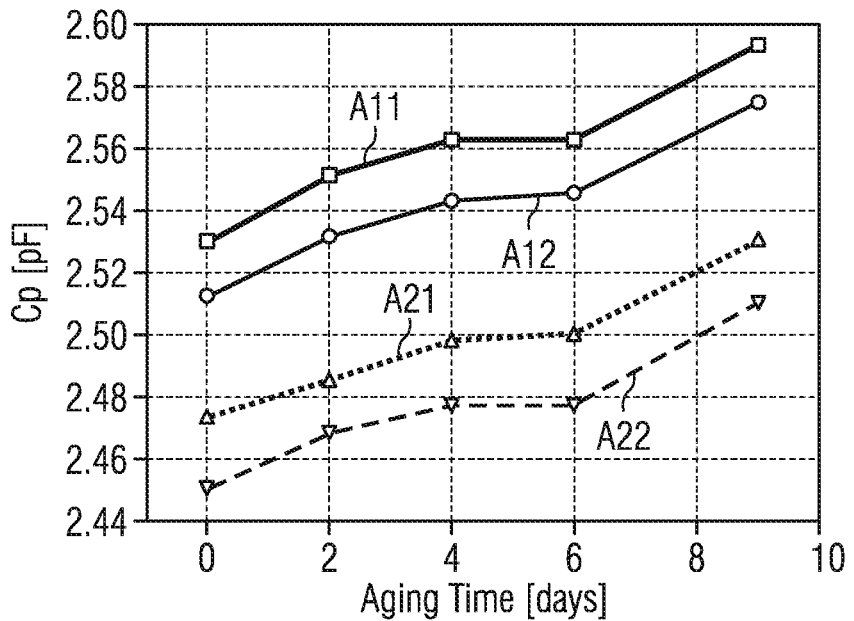
FIGS. 5A to 5D show exemplary measurements of a capacitive sensor.
Figure 5B:
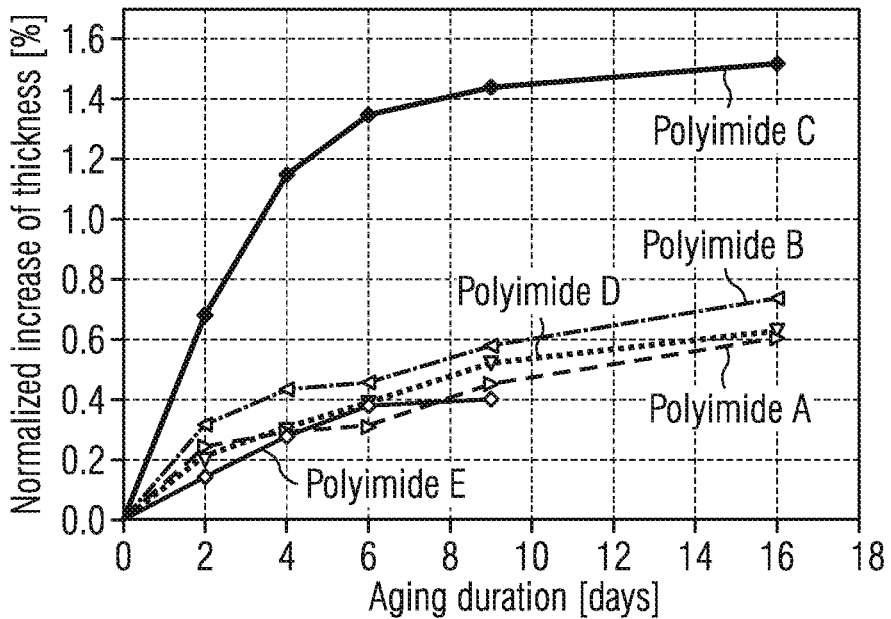
Figure 5C:
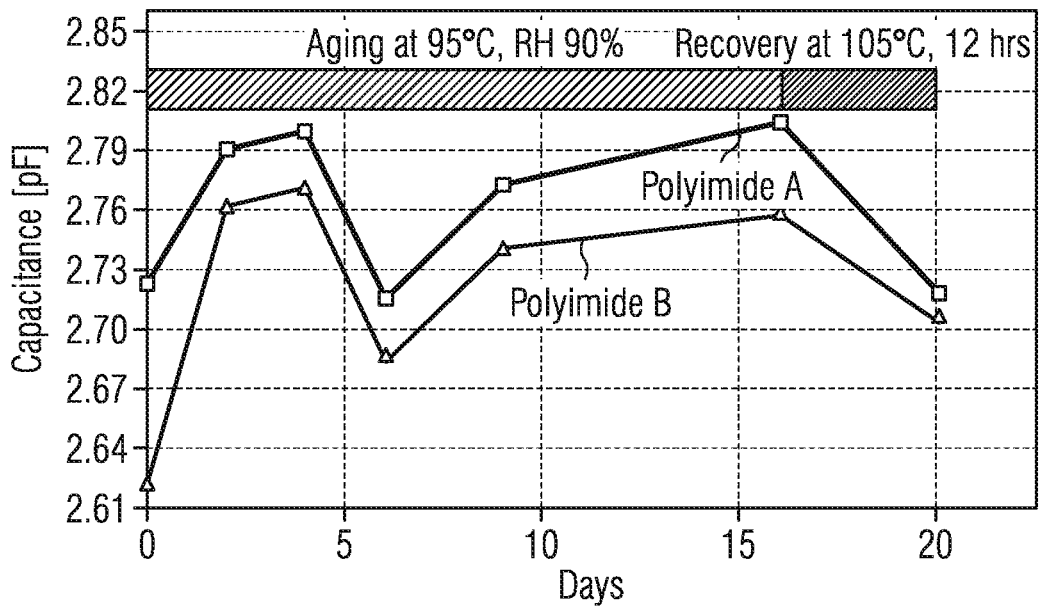
Figure 5D:
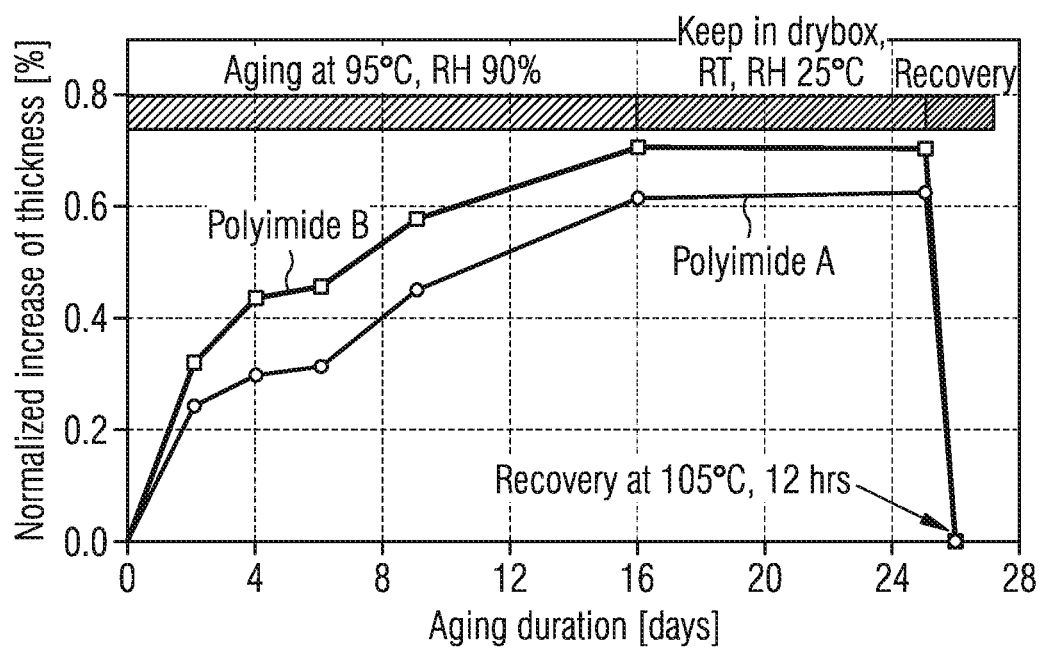

FIGS. 5A to 5D show exemplary measurement results of a capacitive sensor 11 realized as an interdigitated capacitor. The interdigitated capacitor may have, for example, only first and second electrode lines. In FIGS. 5A and 5C, a measured off-set in capacitance and in FIGS. 5B and 5D, a thickness of a polyimide film after several days of exposure to stress conditions (95% relative humidity, 95° C.) and subsequent recovery treatment is shown. As shown in FIGS. 5A to 5D, the amount of drift is different for different material properties. The sensor arrangement 10 exploits these differences to identify drift and trigger a warning or on-chip countermeasures, if possible.

Some examples of drift in relative humidity sensors after exposure to extreme conditions show that after 16 days of stress (95° C., 95% relative humidity), there is approximately 0.4 to 1.5% permanent expansion of the polymer and the polymer capacitance has changed approximately 0.2%. Advantageously, a recovery treatment regenerates the material 30 and partially removes drift.

Figure 6:
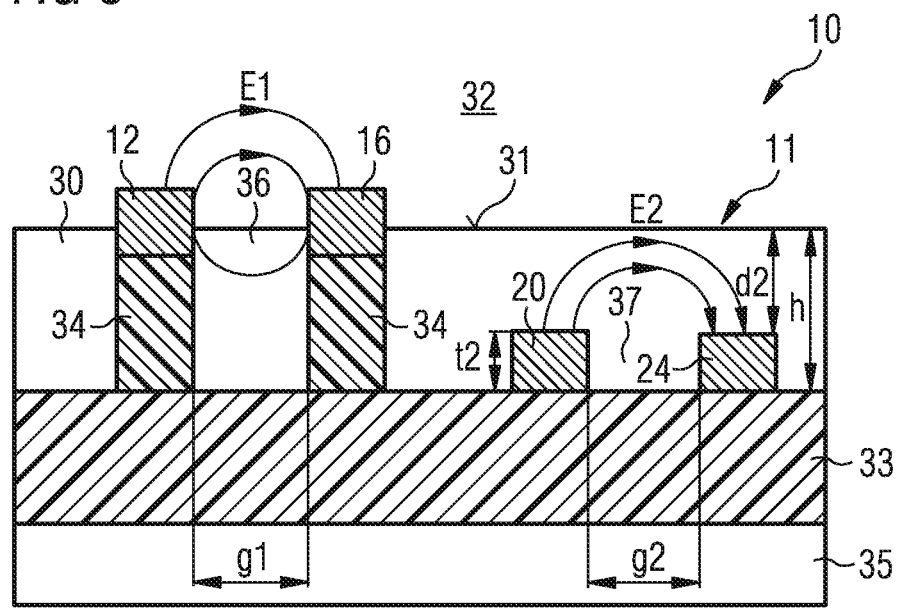
FIG. 6 shows a further exemplary embodiment of a sensor arrangement.

FIG. 6 shows a further exemplary embodiment of the capacitive sensor 11 of the sensor arrangement 10 that is a further development of the above-shown embodiments. The capacitive sensor 11 comprises the first, second, third and fourth electrode lines 12, 16, 20, 24. The third and fourth electrode line 20, 24 have a top surface covered by the sensitive layer 30. The first and second electrode line 12, 16 have a top surface and a bottom surface such that the interface 31 of the sensitive layer 30 and the ambient gas 32 is below the top surface and above the bottom surface of the first and second electrode line 12, 16.

The invention claimed is:

1. A sensor arrangement, comprising:
   a capacitive sensor comprising:
   a first electrode line, a second electrode line, a third electrode line and a fourth electrode line, and
   a sensitive layer arranged at the first, the second, the third and the fourth electrode line, and
   a readout circuit comprising a capacitance-to-digital converter, wherein the readout circuit is coupled to the first, the second, the third and the fourth electrode line, and
   wherein the readout circuit is configured to generate a first measurement signal using the first and the second electrode line and a second measurement signal using the third and the fourth electrode line,
   wherein each of the first and the second electrode lines comprises a respective top surface and a respective bottom surface such that an interface of the sensitive layer and an ambient gas is below the top surfaces and above the bottom surfaces of the first and second electrode line, and wherein the first and the second electrode lines form a first capacitor that is partially covered by the sensitive layer, and wherein each of the third and the fourth electrode lines comprises a respective top surface covered by the sensitive layer, wherein the third and the fourth electrode lines form a second capacitor that is completely buried in the sensitive layer, and wherein the sensitive layer is exposed to the ambient gas.

2. The sensor arrangement according to claim 1, wherein the sensor arrangement is configured as a humidity sensor arrangement and the sensitive layer is configured to absorb water molecules.

3. The sensor arrangement according to claim 1, wherein the sensitive layer is made of a polyimide.

4. The sensor arrangement according to claim 1, wherein the first, second and third electrode line are configured such that the first measurement signal depends more on a swelling of the sensitive layer than the second measurement signal.

5. The sensor arrangement according to claim 1, wherein the first, second and third electrode lines are configured such that a dependency of the second measurement signal on bulk properties of the sensitive layer is greater than a dependency of the first measurement signal on the bulk properties of the sensitive layer.

6. The sensor arrangement according to claim 1, wherein the readout circuit is configured to provide a gas signal as a function of the first and the second measurement signal.

7. The sensor arrangement according to claim 1, wherein the readout circuit is configured to provide a drift signal as a function of the first and the second measurement signal.

8. The sensor arrangement according to claim 7, wherein the readout circuit comprises a memory and is configured to provide the drift signal as a function of the first and the second measurement signal and data stored in the memory.

9. The sensor arrangement according to claim 8, wherein the readout circuit is configured to compare the first and the second measurement signal with correlation data stored in the memory and calculate the drift signal depending on the result of the comparison.

10. The sensor arrangement according to claim 7, wherein the sensor arrangement is configured to perform an off-set correction, to generate a warning signal and/or to start a regeneration cycle depending on the value of the drift signal.

11. The sensor arrangement according to claim 1, wherein the capacitive sensor comprises a semiconductor substrate and at least a dielectric layer on top of the semiconductor substrate.

12. A method for generating measurement signals, comprising: generating a first measurement signal using a first and a second electrode line of a capacitive sensor by a readout circuit, and generating a second measurement signal using a third and a fourth electrode line of the capacitive sensor by the readout circuit, wherein the capacitive sensor comprises a sensitive layer, wherein the first, the second, the third and the fourth electrode line are arranged in the sensitive layer, and wherein the readout circuit comprises a capacitance-to-digital converter, wherein;

each of the first and the second electrode lines comprises a respective top surface and a respective bottom surface such that an interface of the sensitive layer and an ambient gas is below the top surfaces and above the bottom surfaces of the first and second electrode line, wherein each of the third and the fourth electrode lines comprises a respective top surface covered by the sensitive layer, and wherein the sensitive layer is exposed to the ambient gas, or the interface of the sensitive layer and the ambient gas is below the top surfaces and above the bottom surfaces of the first and second electrode line, the first electrode line is arranged on top of the third electrode line, the second electrode line is arranged on top of the fourth electrode line and a further dielectric layer is arranged between the first and the third electrode lines and between the second and the fourth electrode lines, and wherein the first and the second electrode lines form a first capacitor that is partially covered by the sensitive layer, and wherein the third and the fourth electrode lines form a second capacitor that is completely buried in the sensitive layer.

13. A sensor arrangement, comprising:

a capacitive sensor comprising:

a first electrode line, a second electrode line, a third electrode line and a fourth electrode line, and a sensitive layer, wherein the first, the second, the third and the fourth electrode line are arranged in the sensitive layer, and a readout circuit comprising a capacitance-to-digital converter, wherein the readout circuit is coupled to the first, the second, the third and the fourth electrode line, and wherein the readout circuit is configured to generate a first measurement signal using the first and the second electrode line and a second measurement signal using the third and the fourth electrode line, wherein each of the first and the second electrode lines comprises a respective top surface and a respective bottom surface such that an interface of the sensitive layer and an ambient gas is below the top surfaces and above the bottom surfaces of the first and second electrode line, and wherein the first and the second electrode lines form a first capacitor that is partially covered by the sensitive layer and wherein the first electrode line is arranged on top of the third electrode line, the second electrode line is arranged on top of the fourth electrode line and a further dielectric layer is arranged between the first and the third electrode lines and between the second and the fourth electrode lines, and wherein the third and the fourth electrode lines form a second capacitor that is completely buried in the sensitive layer.

* * * * *